(12) United States Patent
Salmon

(10) Patent No.: US 10,057,688 B2
(45) Date of Patent: Aug. 21, 2018

(54) LEAD FRAME-BASED CHIP CARRIER USED IN THE FABRICATION OF MEMS TRANSDUCER PACKAGES

(71) Applicant: Robert Bosch GmbH, Stuttgart (DE)

(72) Inventor: Jay Scott Salmon, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 126 days.

(21) Appl. No.: 14/930,907

(22) Filed: Nov. 3, 2015

(65) Prior Publication Data

US 2016/0134974 A1   May 12, 2016

Related U.S. Application Data

(60) Provisional application No. 62/075,980, filed on Nov. 6, 2014.

(51) Int. Cl.
*H04R 19/00* (2006.01)
*H04R 1/04* (2006.01)
(Continued)

(52) U.S. Cl.
CPC ....... *H04R 19/005* (2013.01); *B81C 1/00301* (2013.01); *H04R 1/04* (2013.01);
(Continued)

(58) Field of Classification Search
CPC ....... H01L 2224/16; H01L 2924/01079; H01L 2924/01078; H01L 2924/14; H01L 2924/15311; H01L 2924/1461
See application file for complete search history.

(56) References Cited

U.S. PATENT DOCUMENTS 6,683,370 B1   1/2004   McDonald et al.
7,795,078 B2   9/2010   Ramakrishna et al.
(Continued)

FOREIGN PATENT DOCUMENTS

JP    2010021519 A    1/2010
JP    2010035070 A    2/2010
WO    2011082214 A2   7/2011

OTHER PUBLICATIONS

International Search Report and Written Opinion for Application No. PCT/US2015/058729 dated Jan. 14, 2016 (12 pages).
(Continued)

*Primary Examiner* — Quoc Hoang
(74) *Attorney, Agent, or Firm* — Michael Best & Friedrich LLP

(57) ABSTRACT

Systems and methods for lead frame-based chip carriers for use with MEMS transducers. One embodiment provides a method for manufacturing a MEMS microphone package. In one exemplary embodiment, the method includes flip chip bonding a first plurality of I/O pads on an application specific integrated circuit to a plurality of traces on a lead frame. The method further includes removing at least one of the plurality of traces such that at least one of the first plurality of I/O pads is electrically isolated from the lead frame. The method further includes bonding the lead frame to a lid and electrically connecting, via at least one wire bond, a MEMS microphone mounted to the lid to the application specific integrated circuit using a second plurality of I/O pads of the application specific integrated circuit. The method further includes bonding a substrate to the lead frame to form an air tight volume within the lid.

12 Claims, 5 Drawing Sheets

(51) Int. Cl.
  *B81C 1/00* (2006.01)
  *H04R 19/04* (2006.01)

(52) U.S. Cl.
  CPC .... *H04R 19/04* (2013.01); *H01L 2224/05554* (2013.01); *H01L 2224/48137* (2013.01); *H01L 2224/73207* (2013.01); *H01L 2224/92* (2013.01); *H01L 2924/00014* (2013.01); *H01L 2924/16151* (2013.01); *H01L 2924/16152* (2013.01); *H04R 2201/003* (2013.01); *H04R 2201/029* (2013.01)

(56) References Cited

U.S. PATENT DOCUMENTS

| | | | |
|---|---|---|---|
| 7,836,764 B2 | 11/2010 | Theuss et al. | |
| 7,927,920 B2 * | 4/2011 | Sasaki | H01L 23/49548 257/E21.001 |
| 8,624,387 B1 | 1/2014 | Minervini | |
| 2007/0222008 A1 | 9/2007 | Chen et al. | |
| 2010/0207257 A1 | 8/2010 | Lee | |
| 2012/0153771 A1 | 6/2012 | Formosa et al. | |
| 2012/0261791 A1 | 10/2012 | Haba et al. | |
| 2013/0032905 A1 | 2/2013 | Lo et al. | |
| 2014/0246738 A1 | 9/2014 | Protheroe et al. | |
| 2014/0246739 A1 | 9/2014 | Protheroe et al. | |
| 2014/0312439 A1 | 10/2014 | Hoegerl et al. | |

OTHER PUBLICATIONS

Jun Su Lee et al., A Cost-Effective MEMS Cavity Packaging Technology for Mass Production, IEEE Transactions on Advanced Packaging, vol. 32, No. 2, May 2009 (8 pages).

Notice of Preliminary Rejection from the Korean Intellectual Property Office for Application No. 10-2017-7015380 dated Nov. 15, 2017 (4 pages).

\* cited by examiner

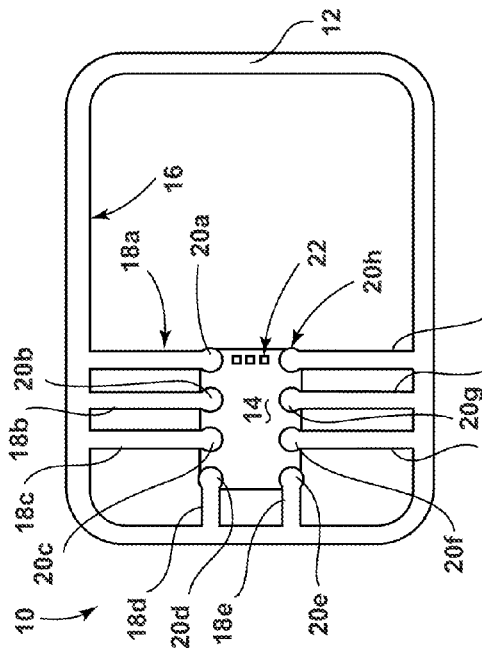
FIG. 1
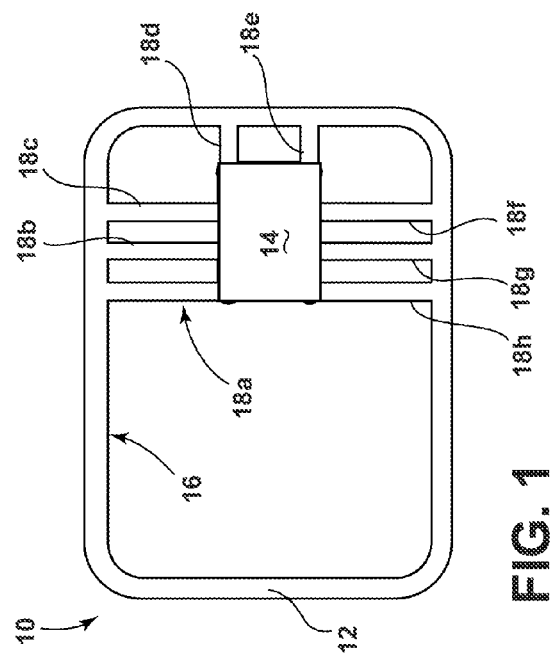
FIG. 2
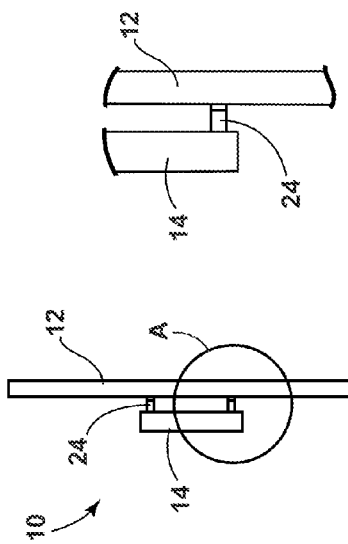
FIG. 4A  FIG. 4B
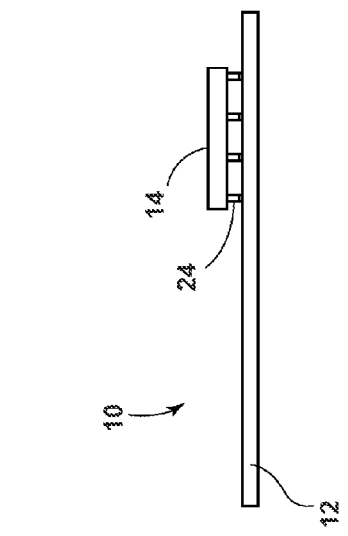
FIG. 3

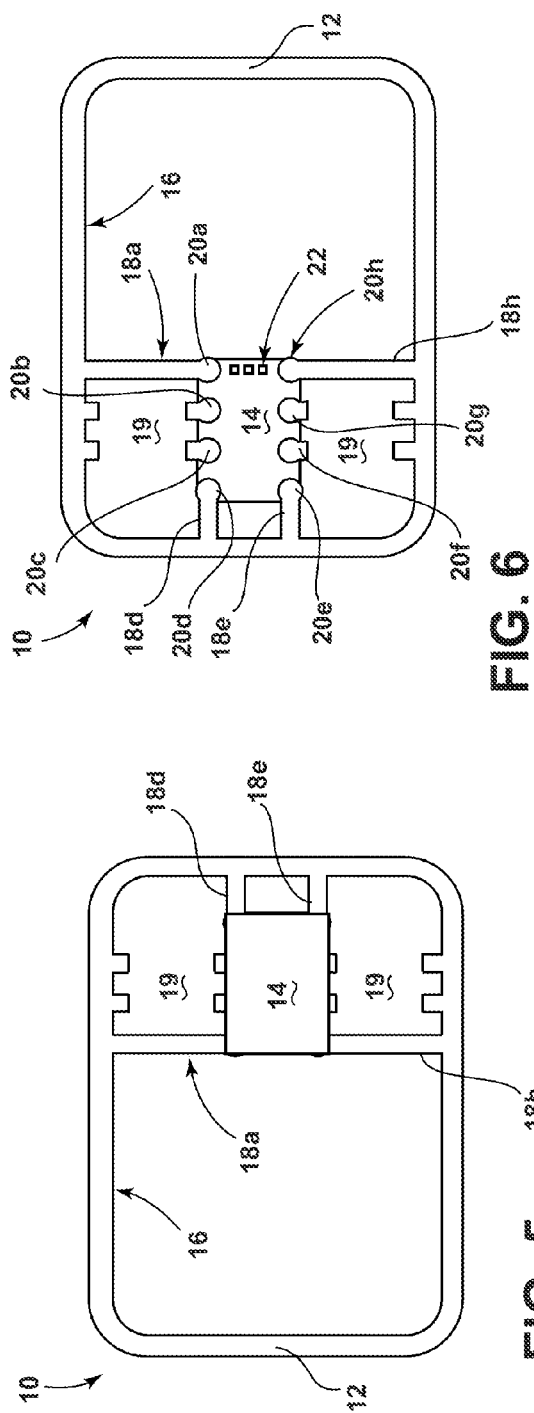

LEAD FRAME-BASED CHIP CARRIER USED IN THE FABRICATION OF MEMS TRANSDUCER PACKAGES

CROSS-REFERENCE TO RELATED CASES

This application claims benefit of U.S. Provisional Patent Application No. 62/075,980 filed on Nov. 6, 2014, the entire contents of which are incorporated herein by reference.

FIELD

Embodiments of the invention relate to micro-electromechanical system (MEMS) transducer packages, and more particularly, to the fabrication of MEMS transducer packages with a lead frame-based chip carrier.

BACKGROUND

MEMS microphones are used in electronic devices such as, for example, smart telephones, tablet computers, and laptop computers. Generally speaking, a MEMS microphone is an acoustic MEMS transducer that typically includes a membrane and a backplate with multiple perforations. Changes in air pressure created by sound waves cause the membrane to flex. The backplate remains substantially stationary, as air moves through its perforations. The movement of the membrane creates a change in the amount of capacitance between the membrane and the backplate. Voltage variations caused by the change in the capacitance provide an output that is related to the pressure of the sound waves. The output is often provided to an integrated circuit, for example, an application specific integrated circuit (ASIC) for additional processing. Often, a MEMS microphone is packaged in a housing that provides protection from damage, a desired acoustic environment, and electrical connections from the MEMS package to other components.

SUMMARY

While existing MEMS transducer packages are functional, there is a need for improved packages and, more particularly, for packages that 1) allow electrical connections from two directions (above and below the ASIC die); 2) provide land grid array (LGA) connections on some ASIC bond pads and while leaving other bond pads exposed for conventional wire bonding; and 3) provide a first subset of electrical connections that have high electrical isolation and a second subset of electrical connections that have low electrical isolation.

Certain embodiments provide a lead frame chip carrier that permits placement and electrical isolation of selected LGA pads on a flip chip mounted die. Certain embodiments also create an interpose layer in an overall microphone package that facilitates the translations of signals routed from two separate directions (above and below) with respect to the top surface of the chip mounted on the lead frame chip carrier.

One embodiment provides a method for manufacturing a MEMS microphone package. In one exemplary embodiment, the method includes flip chip bonding a first plurality of I/O pads on an application specific integrated circuit to a plurality of traces on a lead frame. The method further includes removing at least one of the plurality of traces such that at least one of the first plurality of I/O pads is electrically isolated from the lead frame. The method further includes bonding the lead frame to a lid and electrically connecting, via at least one wire bond, a MEMS microphone mounted to the lid to the application specific integrated circuit using a second plurality of I/O pads of the application specific integrated circuit. The method further includes bonding a substrate to the lead frame to form an air tight volume within the lid.

Other aspects of the invention will become apparent by consideration of the detailed description and accompanying drawings.

BRIEF DESCRIPTION OF THE DRAWINGS

FIG. 1 is a top view of a lead frame for a MEMS microphone, according to some embodiments.

FIG. 2 is a bottom view of a lead frame for a MEMS microphone, according to some embodiments.

FIG. 3 is an elevation view of a lead frame for a MEMS microphone, according to some embodiments.

FIG. 4A is a side view of a lead frame for a MEMS microphone, according to some embodiments.

FIG. 4B is a partial side view of a lead frame for a MEMS microphone, according to some embodiments.

FIG. 5 is a top view of a lead frame for a MEMS microphone with some leads removed, according to some embodiments.

FIG. 6 is a bottom view of a lead frame for a MEMS microphone with some leads removed, according to some embodiments.

FIG. 7 is a bottom view of a MEMS microphone package, according to some embodiments.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

It should also be noted that a plurality of hardware and software based devices, as well as a plurality of different structural components may be used to implement the invention. In addition, it should be understood that embodiments of the invention may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic based aspects of the invention may be implemented in software (e.g., stored on non-transitory computer-readable medium) executable by one or more processors. As such, it should be noted that a plurality of hardware and software based devices, as well as a plurality of different structural components may be utilized to implement the invention. For example, "control units" and "controllers" described in the specification can include one or more processors, one or more memory modules including non-transitory computer-readable medium, one or more input/output interfaces, and various connections (e.g., a system bus) connecting the components.

It should also be noted that, in the specification and the claims, the terms "top," "above," "below," "beneath," "bottom," and the like are used in reference to the described embodiments as they lie horizontally. This is done for ease of description, and should not be considered limiting.

Figure 8:
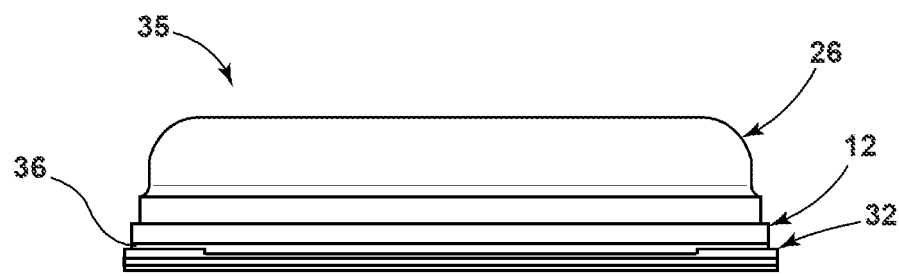
FIG. 8 is an elevation view of a MEMS microphone package, according to some embodiments.

FIG. 1 illustrates one exemplary embodiment of a chip carrier assembly 10 viewed from the top. FIG. 2 illustrates the same chip carrier assembly 10 viewed from the bottom. In the example illustrated, the chip carrier assembly 10 includes a lead frame 12 and an application specific integrated circuit (ASIC) die 14. As set forth in detail below, the ASIC die 14 is flip chip bonded to the lead frame 12. The lead frame 12 is a stamped metal frame manufactured from copper or another suitable electrically conductive material. The lead frame 12 is partially defined by a rounded rectangular perimeter seal ring 16 and is further defined by a plurality of traces 18a-18h. In one embodiment, the lead frame 12 may be sized and shaped to the shape and size of a structure such as a substrate 32 or a metal lid 26 (for example, as illustrated in FIG. 8). Depending on the application, any configuration and size of the lead frame 12 can be used without affecting the scope of the disclosure. In the illustrated construction, there are eight traces 18a-18h that are substantially identical in shape. In alternative embodiments, the traces 18a-18h may vary in dimension and placement. Not all of the traces 18a-18h will be described in detail. It will be appreciated that the plurality of traces 18a-18h can be any quantity of traces; and the eight shown are for illustrative purposes only. As illustrated in FIG. 2, each of the traces 18a-18h terminates in a plurality of contact pads 20a-20h. As illustrated, the contact pad 20 is circular. In other embodiments, the contact pads 20a-20h may be shaped differently. The perimeter seal ring 16, the traces 18a-18h, and the contact pads 20a-20h are co-planar.

In the embodiment illustrated in FIG. 2, the lead frame 12 is designed such that the traces 18a-18h and the contact pads 20a-20h correspond to at least some I/O pads 22 (for example, land gate array (LGA) pads) on the ASIC die 14. As appreciated by one skilled in the art, the ASIC die 14 includes electronic circuitry configured to power one or more MEMS transducers, receive and process electrical signals received from the one or more MEMS transducers, and communicate those signals to at least one other electrical device. For ease of description, a single ASIC die 14 is illustrated. In alternative embodiments, more than one ASIC die 14 may be bonded to the lead frame 12. In another alternative embodiment, an array of ASIC dies in the form of an ASIC network may be bonded to the lead frame. In another alternative embodiment, a processor, a microprocessor, a microcontroller may be bonded to the lead frame.

The I/O pads 22 are capable of electronically coupling the circuitry in the ASIC die 14 with external circuitry. As illustrated in FIG. 2, the I/O pads 22 are connected to their corresponding contact pads 20a-20h. As illustrated in FIG. 3 and FIG. 4A, the connections are made using flip chip bonds to the corresponding contact pads 20a-20h using flip chip bumps 24. FIG. 4B is an enlarged view of the portion of the chip carrier assembly 10 shown within the circle A in FIG. 4A. As illustrated, the flip chip bumps 24 are columnar. However, other configurations are possible. In alternative embodiments, the flip chip bumps 24 may vary in shape. As illustrated in FIG. 2, not all of the I/O pads 22 are bonded to the lead frame 12. As detailed below, this leaves some of the I/O pads 22 available for wire bonding.

As illustrated in FIG. 5, when the ASIC die 14 is secured to the lead frame 12, some of the traces (18b, 18c, 18f, and 18g as illustrated) may be removed, by, for example, punching them out (leaving an empty area 19 in the lead frame). As illustrated in FIG. 6, punching out the traces 18b, 18c, 18f, and 18g leaves the corresponding contact pads 20b, 20c, 20f, and 20g of the removed traces flip chip bonded to the ASIC die 14. The corresponding I/O pads 22 are thus electrically isolated from one another and the lead frame 12. The I/O pads 22 that remain bonded to the lead frame 12 are the ground leads, or circuit elements that require grounding, of the ASIC die 14.

As illustrated in FIG. 7, the chip carrier assembly 10 is bonded (for example, by using solder or epoxy) to a metal lid 26. The metal lid 26 is conventional, and will not be described in detail. In alternative embodiments, lids of other shapes or materials may be used. A MEMS die 28 is affixed to the metal lid 26. The MEMS die 28 includes a MEMS transducer (not shown). In the illustrated embodiment, the MEMS transducer is a MEMS microphone. In alternative embodiments, the MEMS die may be an inertial sensor, a chemical sensor, a bolometer, an optical sensor, an environmental sensor, a humidity sensor, and the like. In the illustrated embodiment, the MEMS die 28 is mounted to, or affixed to, a top inner wall of the metal lid. In alternate embodiments, the MEMS die 28 may be affixed to any side inner wall of the metal lid. Alternative embodiments may include more than one MEMS die, for example, a first MEMS microphone mounted to the top inner wall of the metal lid and a second MEMS microphone mounted to the side inner wall of the metal lid. In another alternative embodiment, one of the first or second MEMS microphones may be replaced by a non-microphone transducer, such as, for example, an inertial sensor.

As noted above, not all of the I/O pads 22 on the ASIC die 14 are bonded to the lead frame 12. The MEMS die 28 is electrically connected to those I/O pads 22 using the wire bonds 30. As appreciated by one skilled in the art, the wire bonds 30 provide the high-impedance connections required by the MEMS die 28 and the ASIC die 14. The placement of the ASIC die 14 on the lead frame 12 allows the electrical isolation of selected I/O pads 22 on the ASIC die and facilitates the translations of signals routed from two separate directions (for example, above and below) with respect to the top surface of the ASIC die 14. In alternative embodiments including more than one MEMS die 28, the additional MEMS dies may be similarly wire-bonded to the ASIC die 14.

Figure 9:
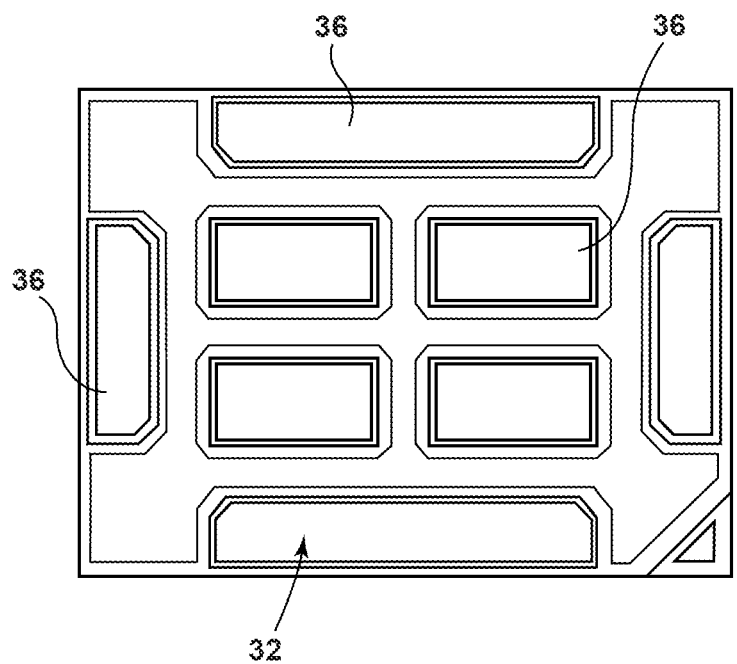
FIG. 9 is a bottom view of a MEMS microphone package, according to some embodiments.

As illustrated in FIG. 8, the metal lid 26 is capped by bonding a substrate 32 to the lead frame 12 using, for example, a weld, solder, or epoxy, to form an air tight MEMS transducer package 35. In the illustrated embodiment, the MEMS transducer package 35 is a MEMS microphone package. As noted above, in alternative embodiments, the MEMS die 28 may include a non-microphone transducer. In one exemplary embodiment, illustrated in FIG. 9, the substrate 32 is a laminated printed circuit board (PCB). In alternative embodiments, the substrate 32 may be a flexible circuit, a foldable circle, a ceramic substrate, a thin film multichip module substrate, a pre-folded substrate, an elastomeric substrate, and the like. The substrate 32 includes substrate pads 36 that align with, and electrically couple to, the contact pads 20a-20h. The MEMS transducer package 35 is may be coupled to suitable surface-mount packaging (for example, a land grid array (LGA)) for assembly into a computing device, such as, for example, a portable telephone, a tablet computer, a personal digital assistant (PDA), a web-enabled cellular telephone, a media player, a hand-held computer, a laptop, a wearable device (such as a watch, a wrist band, or patch), a desktop computer, a gaming console, a remote control, or any similar computing device.

Figure 10:
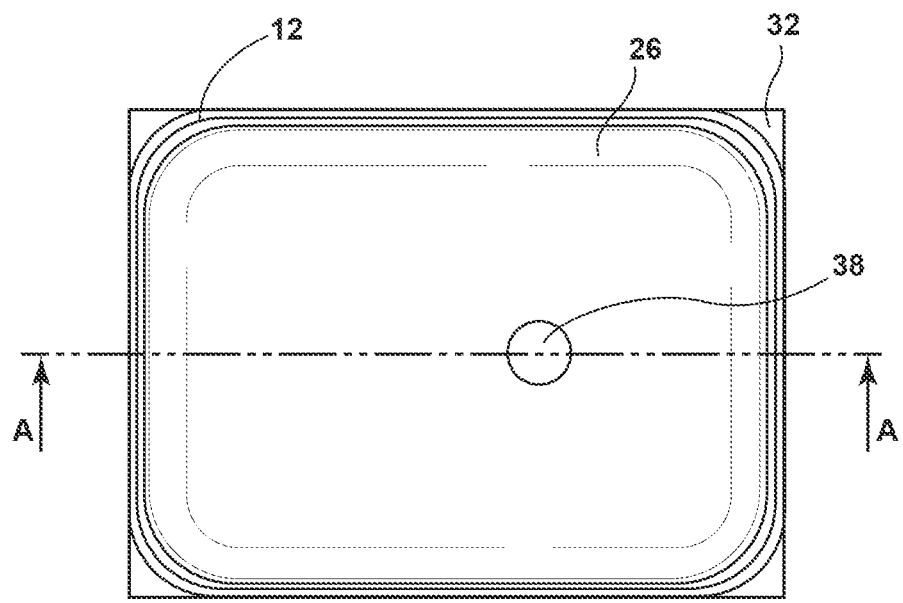
FIG. 10 is a top view of a MEMS microphone package, according to some embodiments.
Figure 11:
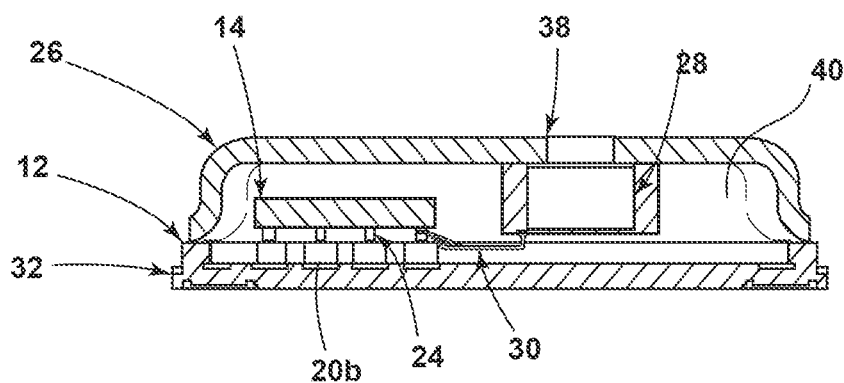
FIG. 11 is a sectional view of a MEMS microphone package, according to some embodiments.

FIG. 10 illustrates a top view of the metal lid 26. As illustrated in FIG. 10 and FIG. 11, the metal lid 26 includes a sound port 38 having a circular cross section and extending downward from the top side of the metal lid 26. In the illustrated embodiment, the MEMS die 28 is a MEMS microphone. Accordingly, the MEMS die 28 is aligned with the sound port 38, enabling sound to reach the acoustic sensor of the MEMS die 28. In alternative embodiments, the sound port 38 may be located adjacent to, or offset from, the MEMS die 28. Alternative embodiments including more than one MEMS die 28 may include a common sound port, or may include more than one sound ports 38, suitably configured to enable sound to reach the MEMS dies.

The seal between the substrate 32 and the metal lid 26 is air tight, forming a back volume 40. The back volume 40 is larger than it would otherwise be if the ASIC die 14 were mounted on a structure other than the lead frame 12 (for example, if a second substrate were used instead). The larger back volume 40 provides a better acoustic environment for the MEMS die 28, which leads to better performance (for example, a higher signal-to-noise ratio) in embodiments where the MEMS die 28 is a MEMS microphone.

Figure 12:
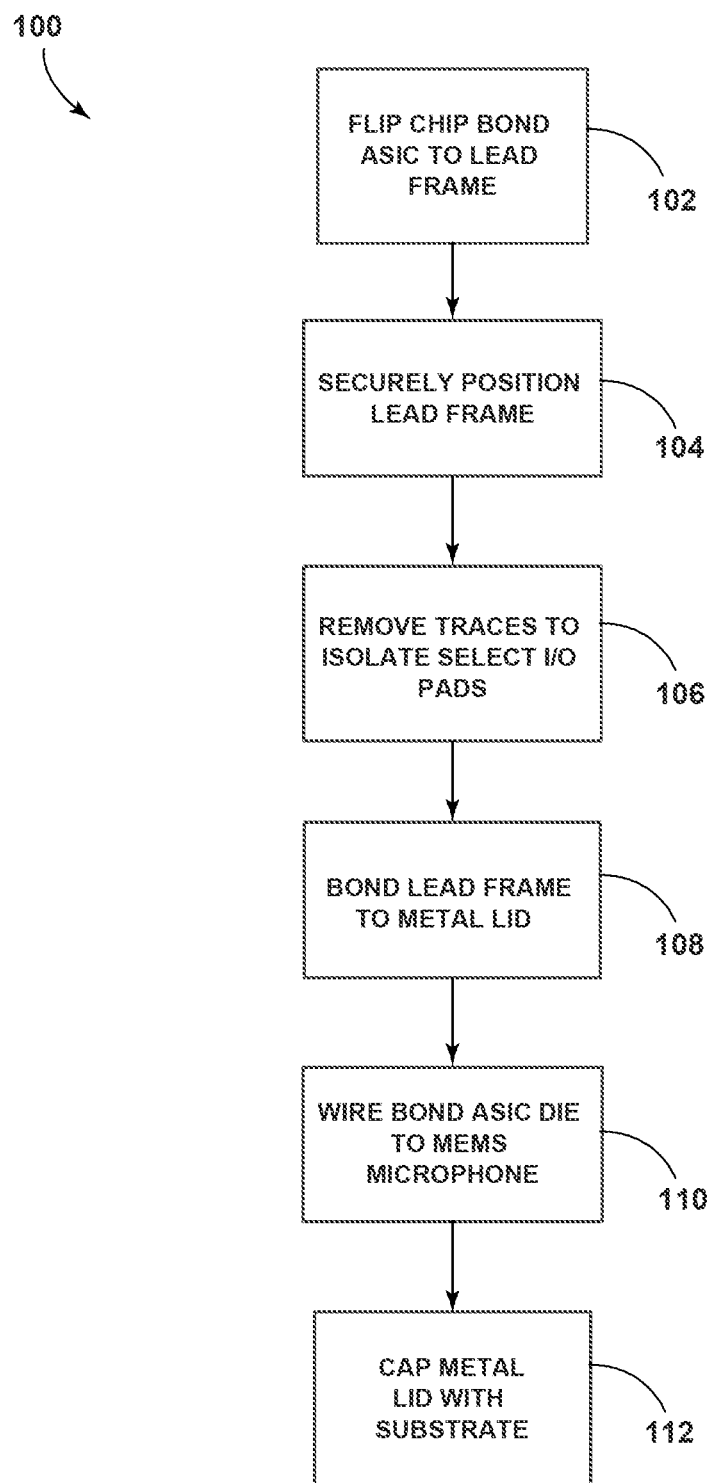
FIG. 12 is a flow chart illustrating a method for producing a MEMS microphone package, according to some embodiments.

FIG. 12 illustrates one exemplary method 100 for manufacturing the MEMS transducer package 35. At block 102, the ASIC die 14 is flip chip bonded to the lead frame 12. As illustrated in FIG. 2, some of the I/O pads 22 remain un-bonded to allow for wire bonding, as described below. In some embodiments, adhesion of the ASIC die 14 to the lead frame 12 may be enhanced through the use of underfill applied in a tape assisted process, or by the use of no-flow underfill epoxy dots applied directly to the IO pads 22 where the flip chip bumps 24 make contact with the lead frame 12. The use of such materials may increase assembly strength and prevent movement of the ASIC die 14 during subsequent assembly steps. At block 104, the lead frame 12, with the ASIC die 14 attached, is securely positioned horizontally. In some embodiments, the lead frame 12 is held in position with clamps. At block 106, some of the traces (18b, 18c, 18f, and 18g as illustrated) in the lead frame 12 are removed. In the illustrated embodiment, the traces 18b, 18c, 18f, and 18g are removed if the I/O pads 22 to which they connect require electrical isolation (for example, power, $V_{DD}$, trim, and signal outputs). In some embodiments, the traces 18b, 18c, 18f, and 18g are removed using a punch configured to remove the desired traces. In alternative embodiments, other suitable means may be used (for example, sawing). As illustrated in FIG. 6, the contact pads 20b, 20c, 20f, and 20g remain bonded to the ASIC die 14 where the corresponding traces have been removed.

At block 108, the lead frame 12 is bonded to the metal lid 26 using, for example, a weld, solder, or epoxy. As illustrated in FIG. 7, the metal lid 26 includes a MEMS die 28, which has been attached to the metal lid in a prior process (not shown). In alternative embodiments, the MEMS die 28 is bonded to the metal lid 26 prior to block 110. At block 110, the MEMS die 28 is wire bonded to the ASIC die 14. Finally, at block 112, the substrate 32 is bonded (using, for example, using a weld, solder, or epoxy) to the lead frame 12 to form an air tight seal with the metal lid 26, resulting in a MEMS transducer package 35 as illustrated in FIGS. 8-11.

Thus, the invention provides, among other things, lead frame-based chip carrier used in the fabrication of metal lid microphones. Various features and advantages of the invention patent are set forth in the following claims.

What is claimed is:

1. A MEMS microphone comprising:
   a lead frame having a plurality of traces and a plurality of contact pads;
   an application specific integrated circuit including a first plurality of I/O pads and a second plurality of I/O pads; and
   a MEMS microphone mounted to a lid;
   wherein the application specific integrated circuit is flip-chip bonded to the lead frame such that a first quantity of the first plurality of I/O pads is electrically connected to at least one of the plurality of traces, and a second quantity of the first plurality of I/O pads is electrically connected to at least one of the plurality of contact pads;
   wherein the second quantity of the first plurality of I/O pads is electrically isolated from the lead frame; and
   wherein the lead frame is bonded to the lid; and the MEMS microphone is electrically connected, via at least one wire bond, to the application specific integrated circuit using the second plurality of I/O pad.

2. The device of claim 1, wherein the lid is a metal lid having a top and a sound port extending through the top; and the MEMS microphone mounted to the metal lid such that the MEMS microphone at least partially aligns the sound port.

3. The device of claim 1, further comprising:
   wherein a substrate is bonded to the lead frame to form an air tight volume within the lid.

4. The device of claim 3, wherein the substrate is a laminated printed circuit board.

5. The device of claim 3, wherein the substrate includes a plurality of substrate pads; and wherein each of the plurality of substrate pads is electrically connected to one of the plurality of contact pads.

6. A MEMS transducer package comprising:
   a MEMS transducer;
   a lead frame having a plurality of traces and a plurality of contact pads; and
   an application specific integrated circuit including a first plurality of I/O pads and a second plurality of I/O pads,
   wherein the application specific integrated circuit is flip-chip bonded to the lead frame such that a first quantity of the first plurality of I/O pads is electrically connected to at least one of the plurality of traces, and a second quantity of the first plurality of I/O pads is electrically connected to at least one of the plurality of contact pads; and
   wherein the second quantity of the first plurality of I/O pads is electrically isolated from the lead frame; and
   wherein the MEMS transducer is electrically connected to the application specific integrated circuit using the second plurality of I/O pads via at least one wire bond.

7. The MEMS transducer package of claim 6, wherein the MEMS transducer is mounted to a lid.

8. The MEMS transducer package of claim 7, wherein the lid includes an opening adjacent to the MEMS transducer.

9. The MEMS transducer package of claim 8, wherein the lead frame is bonded to the lid.

10. The MEMS transducer package of claim 9, further comprising:
    a substrate bonded to the lead frame to form an air tight volume within the lid.

11. The MEMS transducer package of claim 10, wherein the MEMS transducer is a MEMS microphone.

12. The MEMS transducer package of claim 10, wherein the substrate is a printed circuit board.

\* \* \* \* \*